US011644362B2

United States Patent
Yakuphanoglu

(10) Patent No.: US 11,644,362 B2
(45) Date of Patent: May 9, 2023

(54) ORGANIC LIGHT EMITTING DIODE ANALYZER

(71) Applicant: FIRAT UNIVERSITESI REKTORLUGU, Elazig (TR)

(72) Inventor: Fahrettin Yakuphanoglu, Elazig (TR)

(73) Assignee: FIRAT UNIVERSITESI REKTORLUGU, Elazig (TR)

( * ) Notice: Subject to any disclaimer, the term of this patent is extended or adjusted under 35 U.S.C. 154(b) by 146 days.

(21) Appl. No.: 17/244,972

(22) Filed: Apr. 30, 2021

(65) Prior Publication Data

US 2022/0349753 A1 Nov. 3, 2022

(51) Int. Cl.
| | | |
|---|---|---|
| *G01J 3/28* | (2006.01) | |
| *G01R 31/26* | (2020.01) | |
| *G01J 1/42* | (2006.01) | |
| *G01J 3/51* | (2006.01) | |

(52) U.S. Cl.
CPC . *G01J 3/28* (2013.01); *G01J 1/42* (2013.01); *G01J 3/51* (2013.01); *G01R 31/2635* (2013.01); *H10K 71/00* (2023.02); *H10K 71/70* (2023.02); *G01J 2001/4252* (2013.01)

(58) Field of Classification Search
CPC ........ G01J 3/28; G01J 3/14; G01J 3/18; G01J 1/42; G01J 3/51; G01J 3/02; G01J 3/00; G01J 2001/4252; G01R 31/2635; H01L 51/0031; H01L 51/56
See application file for complete search history.

(56) References Cited

U.S. PATENT DOCUMENTS 7,710,369 B2 * 5/2010 Dowling ............ G03G 15/0435
345/83

* cited by examiner

*Primary Examiner* — Abdullahi Nur
(74) *Attorney, Agent, or Firm* — Bayramoglu Law Offices LLC

(57) ABSTRACT

An organic light emitting diode analyzer is provided to test electrical and spectroscopic characteristics organic light emitting diodes (OLED). The analyzer includes a spectrometer, a luminance and color meter, a header of the luminance and color meter, an OLED a source meter, an OLED holder and a computer. The OLED analyzer is a characterization system to measure the electrical and spectral characteristics and feature of the OLED. The luminance and color meter includes a color sensor, and the luminance and color meter measures a luminance of the OLED, a color temperature of the OLED, and color coordinates of the OLED. The spectrometer measures a wavelength of the OLED, an irradiance, a color index, the color temperature, color coordinates and the irradiance (W/m²·nm). The source meter applies positive voltages to the OLED, and the source meter measures a current through the OLED.

12 Claims, 1 Drawing Sheet

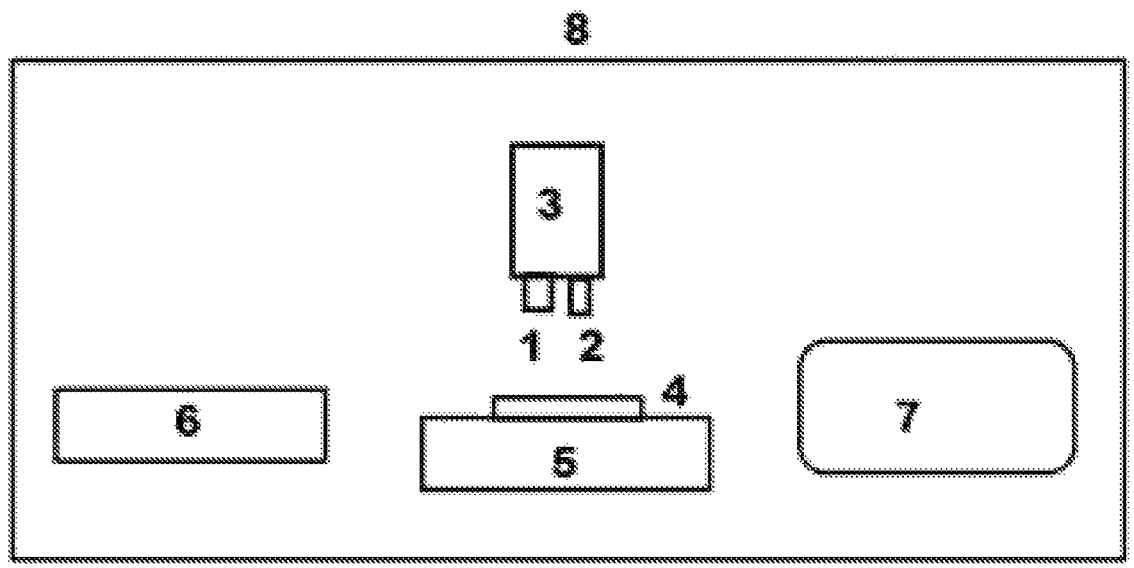

ORGANIC LIGHT EMITTING DIODE ANALYZER

TECHNICAL FIELD

The invention relates to organic light emitting diode analyzer to test electrical and spectroscopic characteristics organic light emitting diodes (OLED).

BACKGROUND

In the OLED characterization device, high-cost CCD cameras are used for electrical characterization and color measurements of OLEDs. An OLED radiates with a voltage applied to the OLED. The color of the glow changes depending on the properties of the materials that make up the OLED. OLEDs are produced from small organic molecules and polymers. OLEDs are a modern light source. They are highly preferred due to their low operating voltage, wide viewing angle and flexible display features. For the use of OLEDs in technological applications, their electrical properties are investigated by current-voltage characteristics, enlightenment-voltage measurements.

In previous techniques, scientists researching the electrical properties of OLEDs measure electrical measurements of OLEDs by bringing different measuring devices side by side. It also requires high costs in terms of cost created by bringing different devices (CCD camera, Luminance meter, current voltage sources) side by side. Because the measuring system consists of different devices, each different. In addition, common software is required to operate these devices simultaneously. It is very difficult and costly to write such software.

There is no complete device that directly measures the electrical and spectral properties of OLEDs (parameters such as OLED's operating voltage, operating current, saturation current, brightness, color index, wavelength of irradiated OLED, color temperature, spectral irradiance). The main task of the present invention is to measure the electrical properties of OLEDs (parameters such as OLED's operating voltage, working current, saturation current, brightness). The invention is also a compact device for automatic or direct measurement.

SUMMARY

An organic electroluminescent (organic EL) diode is known as an organic light-emitting diode (OLED), in which the emissive electroluminescent layer is a film of organic compound that emits light in response to an electric current. This organic layer is placed between two metal electrodes; typically, at least one of these electrodes is transparent. OLEDs are used to create digital displays in devices such as television screens, computer monitors, portable systems such as smartphones, handheld game consoles and PDAs. A major area of research is the development of white OLED devices for use in solid-state lighting applications.

The present invention is related to an OLED analyzer comprising a source meter, a luminance meter and a spectrometer.

The invention disclosure relates to an OLED analyzer measuring electrical characteristics and which is comprising of a source meter.

The invention disclosure relates to an OLED analyzer measuring spectral characteristics and which is comprising of a luminance meter and spectrometer.

The invention is a fully OLED analyzer measuring the electrical and spectral properties of organic light emitting diodes (OLED).

The OLED analyzer comprises of a source meter measuring electrical parameters of OLED, operating current, operating voltage, mobility, current efficiency, power efficiency.

The OLED analyzer comprises of a spectrometer measuring spectral parameters of OLED, the wavelength of irradiated OLED, color index, color temperature, color coordinates, spectral irradiance.

The system is a device that graphically displays the electrical and spectral measurement results of OLEDs and saves all data to the computer.

BRIEF DESCRIPTION OF THE DRAWINGS

FIGURE is a schematic representation of the OLED characterization system.

CORRESPONDENCE OF NUMBERS IN THE FIGURES

1. Illuminance meter and color meter
2. Probe of spectrometer
3. Header of illuminance meter and color meter
4. OLED
5. OLED test holder
6. Source meter
7. Computer
8. OLED analyzer system

DETAILED DESCRIPTION OF THE EMBODIMENTS

OLED analyzer (8), luminance and color meter (1), probe of spectrometer (2), header of illuminance and color meter (3), OLED (4), OLED analyzer (5) source meter (6) computer (7)

The OLED analyzer (8) measures the electrical and spectral characteristics of OLEDs. The electronic parameters are the operating current, operating voltage, mobility, current efficiency, power efficiency.

The OLED analyzer (8) measures the spectral characteristics of OLEDs. The spectral parameters are the wavelength of irradiated OLED, color index, color coordinates, color temperature, spectral irradiance.

The electrical measurements of OLED are current-voltage characteristics, current efficiency-voltage characteristics, luminance-voltage characteristics, power efficiency-voltage characteristics, color coordinates characteristics. The electrical measurements are used to obtain electronic parameters of OLED, which are operating current, operating voltage, mobility, current efficiency, power efficiency.

The spectral measurements of OLED are irradiance-wavelength characteristics, color index characteristics and color temperature characteristics. The spectral measurements are used to obtain electronic parameters of OLED, which are wavelength of irradiated OLED, color index, color temperature, color coordinates, spectral irradiance.

The results of electrical and spectral measurements are made to analyze the production technical parameters of the OLED. The production technical parameters of OLED are the operating current, operating voltage, color index, irradiance, wavelength of irradiated OLED, color temperature and color coordinates of the OLED. These parameters are the operational parameters of OLED that need to be printed on manufactured OLEDs.

Operating current is the current operating of OLED. This current passing through the OLED enables the OLED to give a constant color.

Luminance and color meter (1) is comprised of an electronic sensor that measures the brightness and color coordinates of the OLED. Luminance means brightness, which is a photometric measure of luminous intensity per unit area in a given direction. The unit of luminance is candela per unit square meter, ie candela/m$^2$ (Cd/m$^2$). In other words, it measures the brightness of the OLED per unit area. Brightness means light flux per unit area.

Luminance and color meter (1), which is comprised of a color sensor that performs color measurement, measures all colors and color temperature of OLEDs and analyzes their color coordinates using the standard CEI 1931 RGB color space 1931 XYZ color space. The CIE 1931 color coordinates space was created by the International Commission on Illumination. The CIE system makes the color characterization of OLED. The color sensor works according to reflection theory. In this theory, as light comes to a surface, it diffuses and some of it burns back. The amount of reflected light is detected by the color sensor and the color of the object is determined.

Color temperature is the temperature of the color irradiated by a light source. Color temperature is the light color environment that light creates in the environment. Its unit is Kelvin (K). Color temperature is the appearance of the color of a white LED. The color temperature of warm light is around 2700K, that of natural white is around 4000K, and that of cool white is around 5000K.

Color coordinates are coordinates that describe a color by its XYZ coordinates. These coordinates define the three-dimensional abstract area color of a color. The color of a newly produced OLED is determined by measuring these coordinates.

In the present invention, the color sensor has a 16 bit analog to digital converter.

The color sensor has an array of 8×2 filtered photodiodes. The color sensor consists of at least 16 photodiodes, 4 red filters, 4 green filters and 4 blue filters. The color sensor, which has these photodiodes and filters, analyzes all color values. Red, green and blue (RGB) filters indicate that the color sensor is an RGB sensor.

The OLED test holder (5) is used to make electrical connections to the OLED to be tested to the measurement system. The holder is dark box. Test holder is comprised of 8 spring pin, switch, BNC cable. 8 spring pins are used to provide electrical connections of OLED to OLED analyzer. The OLED holder (5) consists of micro position markers and a stainless steel base. The micro-positioner moves in the x, y, and z directions.

The OLED characterization device (8) automatically measures OLEDs' current-voltage (I-V) measurements, current efficiency-voltage (J-V) measurements, Luminance-voltage (L-V) measurements, color coordinate measurements (xyz), irradiance-wavelength measurements, color index measurements, color temperature measurements.

The OLED analyzer system (8) makes all electrical and spectral characteristics of an OLED in a compact system. Electrical and spectral characteristics of OLED are given as follow
i) Operating voltage measurements of OLED
ii) Operating current measurements of OLED
iii) Current efficiency-voltage measurements
iv) Color coordinates measurements analysis
v) Color index
vi) Spectral wavelength measurement
vii) Spectral irradiance measurement
viii) Color temperature Current-voltage measurements determine the operating voltage and current values of the OLED. Operating voltage is the voltage at which the OLED steadily illuminates. OLED operating current at which OLED steadily illuminates.

The current drived by the OLED is in the range of micro-ampere (uA) to milli-ampere (mA).

In luminance-voltage measurements, the luminance of the OLED is measured as function of voltage applied to the OLED. In this measurement, the luminance of the OLED remains constant after a steady voltage value. From this steady state measurement, the brightness value of OLED is calculated.

Current efficiency-voltage (I/A-V) measurements are the measurements of current efficiency per unit current. This measurement determines the operating current of the OLED.

Color coordinates measurements analysis are the measurements of color coordinates of OLED. This measurement determine the color coordinates.

The color rendering index shows how natural the colors of objects or their surroundings look with the light of a particular light source. It is a comparative value in which the color impression of a light source can be determined. With the help of the color creation index, the light quality of different lightings is comparable.

Irradiance-wavelength measurements are the measurements of wavelength of irradiated OLED. This measurement determine the wavelength of irradiated OLED.

Spectral irradiance measurements are the measurements irradiance OLED depending on wavelength. This measurement determines the irradiance of OLED by applied voltage.

Color temperature measurements are the measurements temperature of color of OLED.

The color temperature of a light source is the temperature of an ideal black-body radiator that radiates light of a color comparable to that of the light source.

What is claimed is:
1. An organic light emitting diode (OLED) analyzer, comprising:
a luminance and color meter,
a spectrometer,
a header of the luminance and color meter,
an OLED,
an OLED holder,
a source meter, and
a computer;
wherein the OLED analyzer is a characterization system, wherein the characterization system measures electrical and spectral characteristics of the OLED,
the luminance and color meter comprises a color sensor, and the luminance and color meter measures a luminance of the OLED, a color temperature of the OLED, and color coordinates of the OLED,
the spectrometer measures a wavelength of the OLED, an irradiance, a color index, the color temperature, and the color coordinates, and
the source meter applies positive voltages to the OLED, and the source meter measures a current through the OLED.

2. The OLED analyzer according to claim 1, wherein
the OLED analyzer measures electrical and spectral characteristics and a wavelength range of 380 nm-780 nm, and
a current driven by the OLED is in a range of microampere (uA) to milli-ampere (mA).

3. The OLED analyzer according to claim 1, wherein the source meter is a voltage source and current meter; the source meter is a device configured for measuring the current ranging from 1 nanoampere to 500 miliamperes, and the source meter drives a voltage ranging from 0 V to +50 V.

4. The OLED analyzer according to claim 1, wherein the OLED holder to provides electrical and spectral connections to the OLED analyzer; the OLED holder is movable in x, y and z directions.

5. The OLED analyzer according to claim 1, wherein the color sensor is a 16 bit analog-digital converter having an array of 8×2 filtered photodiodes, and the color sensor comprises at least 16 photodiodes, 4 red filters, 4 green filters and 4 blue filters.

6. The OLED analyzer according to claim 1, wherein a microprocessor provides a communication between the source meter and the computer to receive electrical data for electrical and spectral measurements.

7. The OLED analyzer according to claim 1, wherein the spectrometer further measures a wavelength of an irradiated OLED.

8. The OLED analyzer according to claim 1, wherein the wavelength of the OLED measured by the spectrometer ranges from 380 nm to 780 nm.

9. The OLED analyzer according to claim 1, wherein the spectrometer measures a color rendering index of the OLED, ranging from 1 to 100.

10. The OLED analyzer according to claim 9, wherein the OLED analyzer measures, current efficiency, power efficiency, OLED operating current, OLED operating voltage, a wavelength of an irradiated OLED, and spectral irradiance.

11. The OLED analyzer according to claim 1, wherein the color temperature of the OLED measured by the spectrometer ranges from 1700 K to 27000 K.

12. The OLED analyzer according to claim 1, wherein the OLED analyzer is provided with a software, and the OLED analyzer automatically measures current-voltage (I-V) measurements, current efficiency-voltage (J-V) measurements, luminance-voltage (L-V) measurements, a spectral irradiance, the wavelength, the color index and the color temperature by the software.

* * * * *